United States Patent
Ehrman et al.

(10) Patent No.: US 10,690,704 B2
(45) Date of Patent: Jun. 23, 2020

(54) MULTI-ACCESS CONTROL AND MULTI-RELAY SYSTEMS AND METHODS

(71) Applicant: I.D. Systems, Inc., Woodcliff Lake, NJ (US)

(72) Inventors: Michael Ehrman, Upper Saddle River, NJ (US); Gaurav Sheth, Mahwah, NJ (US); Maulik Patel, Monroe, NJ (US)

(73) Assignee: I.D. Systems, Inc., Woodcliff Lake, NJ (US)

( * ) Notice: Subject to any disclaimer, the term of this patent is extended or adjusted under 35 U.S.C. 154(b) by 477 days.

(21) Appl. No.: 15/598,474

(22) Filed: May 18, 2017

(65) Prior Publication Data

US 2018/0337014 A1     Nov. 22, 2018

(51) Int. Cl.
| | | |
|---|---|---|
| *G01R 19/165* | (2006.01) | |
| *H01H 47/22* | (2006.01) | |
| *H01H 50/54* | (2006.01) | |
| *H01H 47/32* | (2006.01) | |
| *H01H 1/00* | (2006.01) | |

(52) U.S. Cl.
CPC ....... *G01R 19/16595* (2013.01); *H01H 47/22* (2013.01); *H01H 47/32* (2013.01); *H01H 50/54* (2013.01); *H01H 2001/0005* (2013.01)

(58) Field of Classification Search
CPC ............. G01R 19/16595; H01H 47/22; H01H 2001/0005; H01H 47/32; H01H 50/54
See application file for complete search history.

(56) References Cited

U.S. PATENT DOCUMENTS

| | | | |
|---|---|---|---|
| 10,418,988 B2 * | 9/2019 | Morimoto | H03K 17/693 |
| 2007/0253132 A1 * | 11/2007 | Nakamura | H02H 6/005 |
| | | | 361/103 |
| 2011/0184677 A1 * | 7/2011 | Tae | G01R 31/3842 |
| | | | 702/63 |
| 2012/0169117 A1 * | 7/2012 | Park | H02J 7/0031 |
| | | | 307/10.7 |
| 2013/0009648 A1 * | 1/2013 | Tae | G01R 31/3278 |
| | | | 324/503 |
| 2016/0064919 A1 * | 3/2016 | Oka | H02H 3/087 |
| | | | 361/91.1 |
| 2016/0293365 A1 * | 10/2016 | Tanaka | H01H 47/32 |
| 2017/0279443 A1 * | 9/2017 | Morimoto | H03K 17/18 |

\* cited by examiner

*Primary Examiner* — Jared Fureman
*Assistant Examiner* — Michael J Warmflash
(74) *Attorney, Agent, or Firm* — Troutman Sanders LLP; James E. Schutz; Brennan M. Carmody

(57) ABSTRACT

A multi-relay including a first relay switch operable over a first current range; a second relay switch operable over a second current range; and a current sensor configured to: detect an input current; in response to the input current being within the first current range, activate the first relay switch; and in response to the input current being within the second current range, activate the second relay switch.

20 Claims, 7 Drawing Sheets

MULTI-ACCESS CONTROL AND MULTI-RELAY SYSTEMS AND METHODS

TECHNICAL FIELD

Aspects of the present disclosure relate to relays, and, more particularly, to multi-access control and multi-relay systems and methods.

BACKGROUND

In the related art, relays typically support only one of a low or a high current. A low-current relay (e.g., turns on with 5 µA loads) may overload with a high current input, while a high-current relay (e.g., turns on with 100 mA loads) can be damaged by repeated exposure to low currents. Accordingly, special care must be taken to ensure that the proper relay, that is, the low-current relay or the high-current relay, is installed in the correct application. This may be difficult when, for example, a relay must be installed by a non-expert third party, or multiple relays are utilized in different portions of an application. Thus, the selection and installation of a relay may take excess time or result in damaged equipment.

In addition, in some circumstances, it may be desirable for a relay to operate across a broad load current range (i.e., in response to both low and high current inputs). For example, a high-current relay in the related art may be able to operate over high currents, but may have a delayed response due to ramp up time of an input current. Meanwhile, a low-current relay in the related art may have a relatively short response time, but may not be compatible with higher input currents.

Accordingly, there is a need for a relay that can operate in both high and low ranges, as well as across high and low ranges.

SUMMARY

Briefly described, and according to one embodiment, aspects of the present disclosure generally relate to a multi-access multi-relay. According to some embodiments, there is provided a multi-relay including: a first relay switch operable over a first current range; a second relay switch operable over a second current range; and a current sensor configured to: detect an input current; in response to the input current being within the first current range, activate the first relay switch; and in response to the input current being within the second current range, activate the second relay switch.

A portion of the first current range may overlap a portion of the second current range.

The first relay switch and the second relay switch may be connected in parallel.

The current sensor may be further configured to: repeatedly monitor the input current; activate the first relay switch while the input current is within the first current range; and activate the second relay switch while the input current is within the second current range.

The current sensor may be further configured to: deactivate the first relay switch when the input current becomes greater than the first current range; and deactivate the second relay switch when the input current becomes lesser than the second current range.

A lower threshold of the first current range may be at least five orders of magnitude less than an upper threshold of the second current range using an Ampere unit of measurement.

The current sensor may be configured to detect the input current, activate the first relay switch, and activate the second relay switch without the use of software components.

The multi-relay may be configured to be installable at either side of load relative to a power source.

The current sensor may be configured to detect the input current through multiple orientations.

According to some embodiments, there is provided a multi-access relay comprising: a first multi-relay; a second multi-relay; first and second contacts for receiving a control current of the first multi-relay; and third and fourth contacts for receiving a control current of the second multi-relay. Each of the first multi-relay and the second multi-relay includes: a respective first relay switch operable over a first current range; a respective second relay switch operable over a second current range; and a respective current sensor configured to: detect the respective control current; in response to detecting the respective control current being within the first current range, activate the respective first relay switch; and in response to detecting the respective control current being within the second current range, activate the respective second relay switch.

For at least one of the first multi-relay and the second multi-relay, a portion of the first current range may overlap a portion of the second current range.

For at least one of the first multi-relay and the second multi-relay, the respective first relay switch and the respective second relay switch may be connected in parallel.

For at least one of the first multi-relay and the second multi-relay, the respective current sensor may be further configured to: repeatedly monitor the respective control current; activate the respective first relay switch while the respective control current in response to detecting the respective control current being within the first current range; and activate the respective second relay switch while the respective control current in response to detecting the respective control current being within the second current range.

For at least one of the first multi-relay and the second multi-relay, the respective current sensor may be further configured to: deactivate the respective first relay switch in response to detecting the respective control current being greater than the first current range; and deactivate the respective second relay switch in response to detecting the respective control current being lesser than the second current range.

For at least one of the first multi-relay and the second multi-relay, a lower threshold of the first current range of the respective first relay switch may be at least five orders of magnitude less than an upper threshold of the second current range of the respective second relay switch using an Ampere unit of measurement.

For at least one of the first multi-relay and the second multi-relay, the respective current sensor may be configured to detect the respective control current, activate the respective first relay switch, and activate the respective second relay switch without the use of software components.

At least one of the first multi-relay and the second multi-relay may be configured to be installed on either side of load relative to a power source.

According to some embodiments, there is provided a method performed by a multi-relay including a first relay switch operable over a first current range, a second relay switch operable over a second current range, and a current sensor, the method including: activating the first relay switch; detecting, by the current sensor, an input current; and in response to detecting that the input current is within the second current range, activating the second relay switch.

The detecting may include detecting, by the current sensor, the input current over time, the activating the first relay switch may include activating the first relay switch while the input current is within the first current range, the activating the second relays switch may include activating the second relay switch while the input current is within the second current range, and the method may further include: deactivating the first relay switch in response to detecting that the input current is outside of the first current range; and deactivating the second relay switch in response to detecting that the input current is outside of the second current range.

An upper threshold of the first current range may be greater than a lower threshold of the second current range; and the activating the second relay switch may be performed while the first relay switch is activated.

BRIEF DESCRIPTION OF THE FIGURES

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein.

DETAILED DESCRIPTION

In some circumstances, circuits must be compatible over various potential ranges. Thus, a relay system may need to operate over or across various current ranges. In some cases, a multi-relay may include a sensor and a plurality of relays that operate over various ranges. The sensor observes an input current and activates a corresponding relay. The relays may provide power to a same output. In some cases, multiple multi-relays may be included in a single package and can respond to respective inputs and provide respective outputs.

In some embodiments, there is provided a multi-access control, multi-relay. In some embodiments, the multi-relay includes a first low-current relay and a second high-current relay connected in parallel. A sensor measures an input current and activates one of the relays based on the current value. In some cases, the relays have overlapping ranges, and the sensor may activate a plurality of the relays in response to detecting an input current within the overlapping portion of the ranges. Therefore, in some cases, the multi-relay may provide a relay response across an enlarged input range. In some circumstances, the multi-relay may be able to provide an early response to higher input currents (i.e., by initially activating a low-current relay as the input current is ramping up, and the activating a high-current relay).

Figure 1:
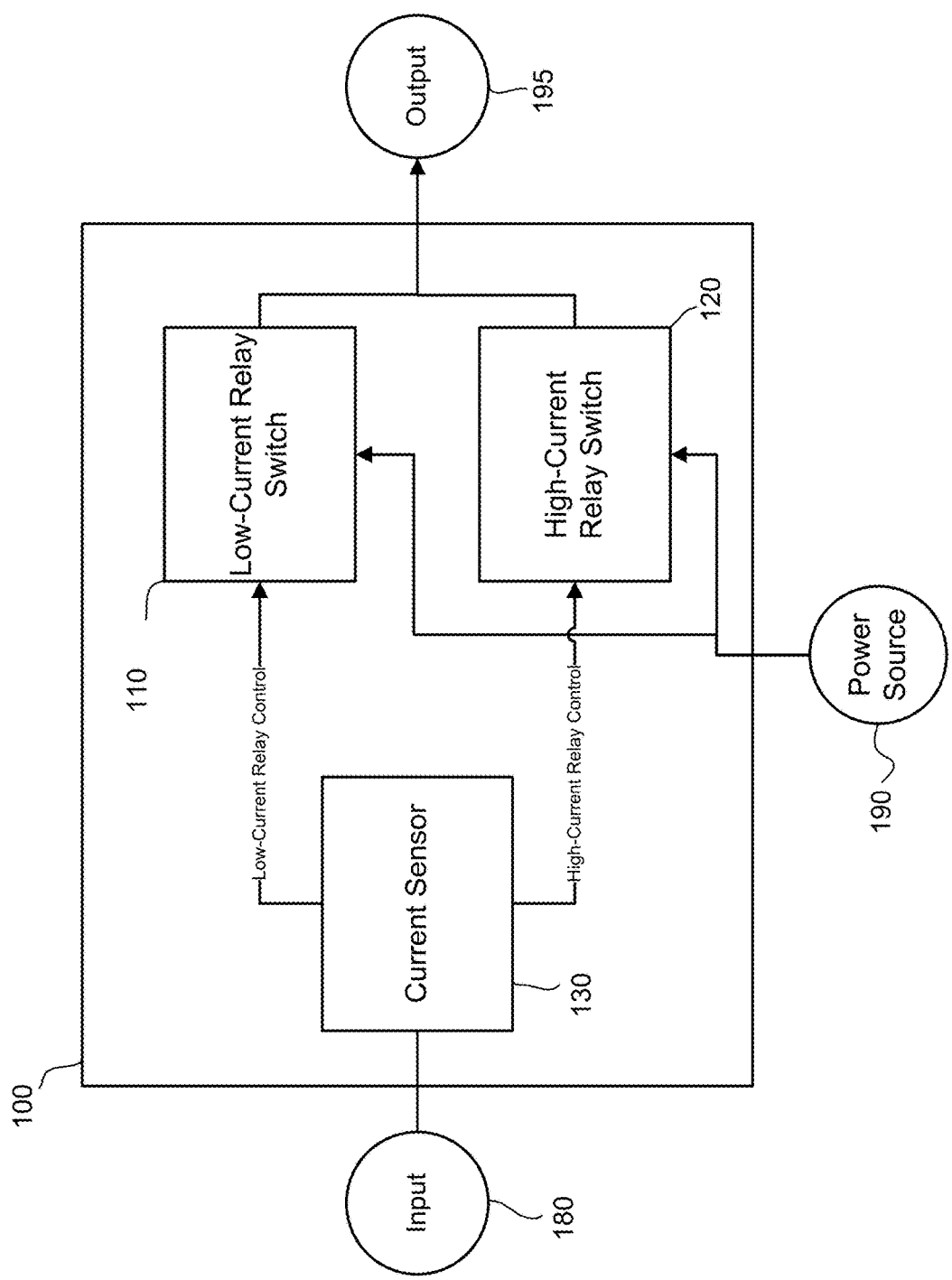
FIG. 1 is block diagram of a multi-relay according to an example embodiment.

Referring now to the figures, FIG. 1 is a block diagram of a multi-relay according to an example embodiment. The multi-relay 100 includes a low-current relay switch 110, a high-current relay switch 120, and a current sensor 130. The low-current relay switch 110 may, for example, respond to signals from as low as 5 µA. The high-current relay switch 120 may, for example, respond to signals as high as 20 A.

In some embodiments, the current sensor 130 may be isolated from the input signal of the low-current relay switch 110 and the high-current relay switch 120. For example, the current sensor 130 may be implemented as a Hall effect sensor.

In the multi-relay 100, the low-current relay switch 110 and the high-current relay switch 120 may be connected in parallel (i.e., the outputs of the respective relay switches are electrically coupled), but receive respective control signals from the current sensor 130. However, this is merely an example, and one of ordinary skill will understand that, in some embodiments, the low-current relay switch 110 and the high-current relay switch 120 may be activated as alternative paths.

When a low current is input 180 into the multi-relay 100, the current sensor 130 detects the low current and a control signal is provided to the low-current relay switch 110; meanwhile, when a high current is input 180 into the multi-relay 100, the current sensor 130 detects the high current and a control signal is provided to the high-current relay switch 120. The low-current relay switch 110 and the high-current relay switch 120 provide an output 195 in response to the respective control signals. Power may be provided through the low-current relay switch 110 and the high-current relay switch 120 by a power source 190 to an output 195.

Although FIG. 1 illustrates a low-current relay switch 110 and a high-current relay switch 120, (i.e., a multi-relay 100) this is merely an example. In some embodiments, the multi-relay 100 may include one or more intermediary-current relay switches, which may be activated over current ranges between the low-current relay switch 110 and the high-current relay switch 120. In some embodiments, the current ranges of the low-current relay switch 110 and the high-current relay switch 120 may overlap or be contiguous, as will be discussed below in more detail with reference to FIG. 3.

In some embodiments, the multi-relay 100 may be installable before or after a powered device. In other words, a current may flow from a source through the relay before reaching the powered device, or flow from the source through the powered device before reaching the relay.

Figure 2:
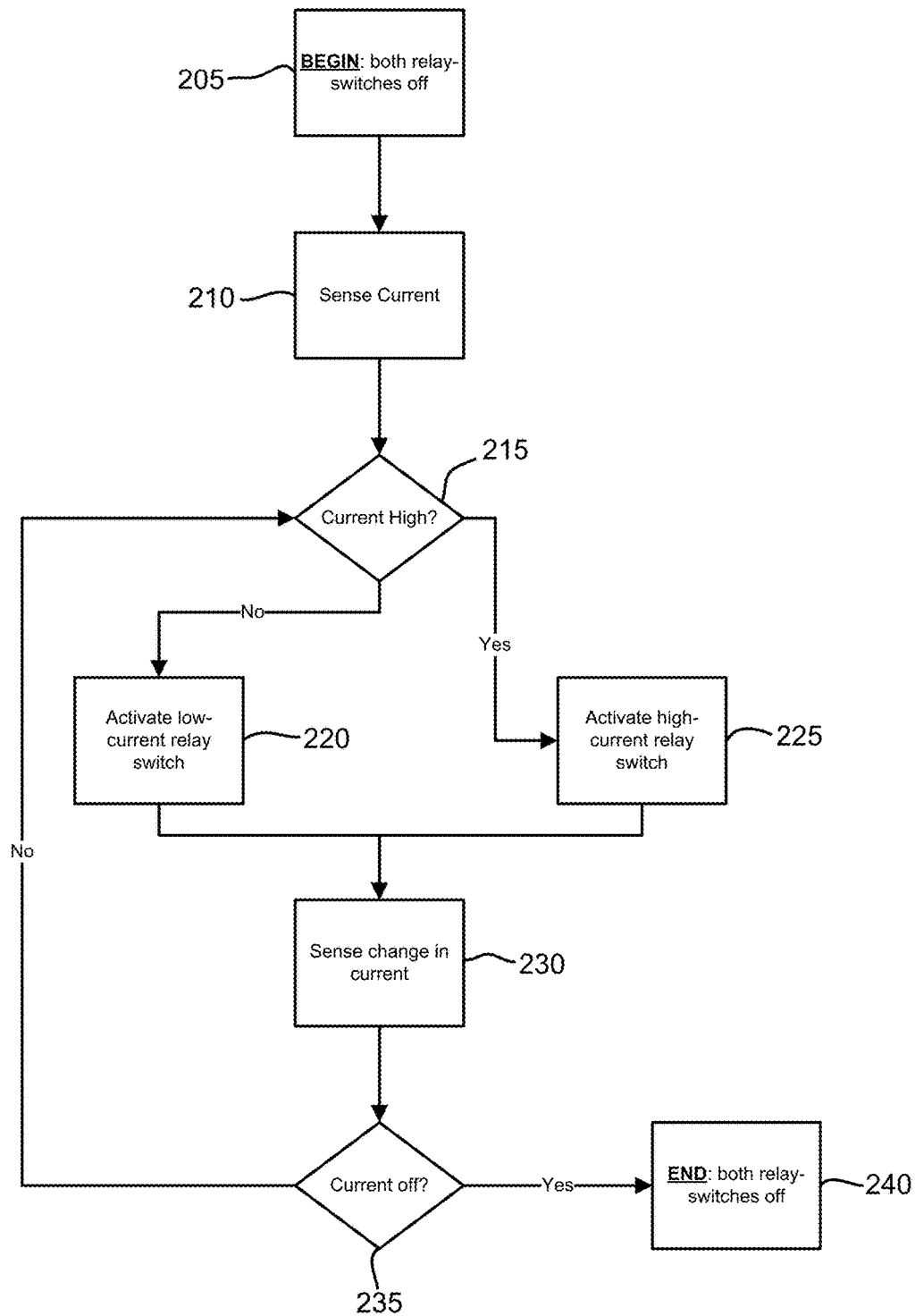
FIG. 2 is a method performed by a multi-relay according to an example embodiment.

FIG. 2 is a flow chart illustrating a method of the multi-relay 100 according to an example embodiment. The method 200 begins 205 with both the low-current relay switch 110 and the high-current relay switch 120 deactivated (i.e., there is no or minimal input current). The current sensor 130 senses 210 current, and detects 215 whether the current is high. If current is low (215—No), the multi-relay 100 activates 220 the low-current relay switch 110. If current is high (215—Yes), the multi-relay 100 activates 225 the high-current relay switch 120. The current senses 130 senses 230 a change in the current, and detects 235 whether the current is off (e.g., zero or minimal). If the current is off (235—Yes), the dual-relay 100 deactivates 240 the low-current relay switch 110 and/or the high-current relay switch 120. If the current is not off (235—No), the current sensor 130 detects 215 whether the current is high.

Figure 3:
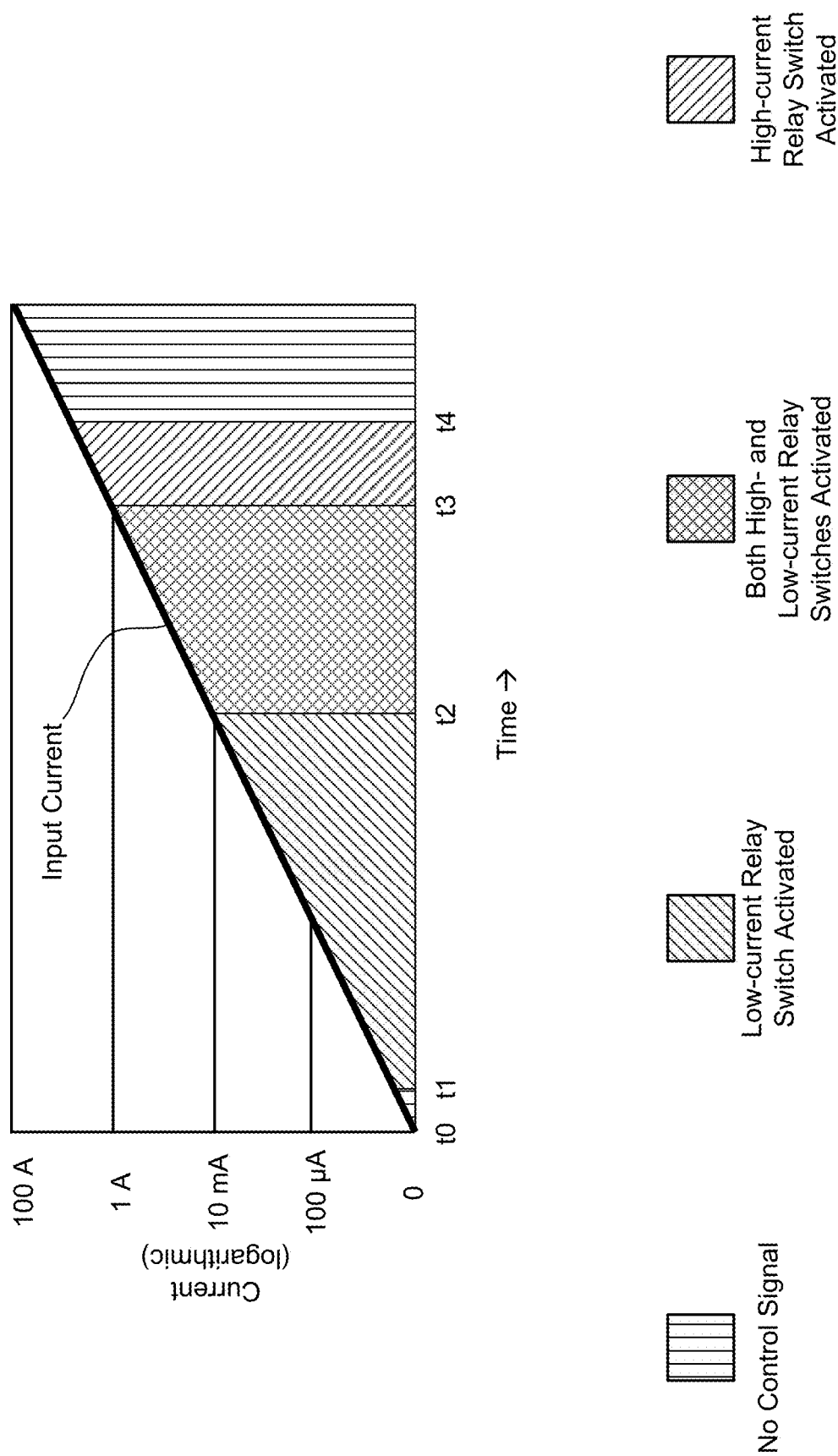
FIG. 3 is a graph illustrating operation of a multi-relay according to an example embodiment.

FIG. 3 is a graph illustrating the change of response of a multi-relay (e.g., the multi-relay 100) over time according to an example embodiment. Referring to FIG. 3, at t0, the input current is 0 and neither the low-current relay switch (e.g., the low-current relay switch 110) nor the high-current relay switch (e.g., the high-current relay switch 120) is activated. At t1, the input current is at a lower threshold (e.g., around 5 μA) of the low-current relay switch, and the low-current relay switch is activated. At t2, the input current is at a lower threshold (e.g., around 10 mA) of the high-current relay switch, and the high-current relay switch is activated. At t3, the input current is at an upper threshold (e.g., around 1 A) of the low-current relay switch, and the low-current relay switch is deactivated. At t4, the input current is at an upper threshold (e.g., around 20 A) of the high-current relay switch, and the high-current relay switch is deactivated.

Accordingly, in some embodiments, the multi-relay 100 may adjust which of the low-current relay switch 110 and/or the high-current relay switch 120 are activated as the input signal changes over time. For example, consider an input generated by pressing a brake in an electric brake system. The input signal will have a certain period of ramp-up time. The multi-relay 100 may respond to an initial lower-voltage by activating the low-current relay switch 110, and may adjust its response by activating the high-current relay switch 120 and then deactivating the low-current relay switch 110 as the input increases.

Figure 4:
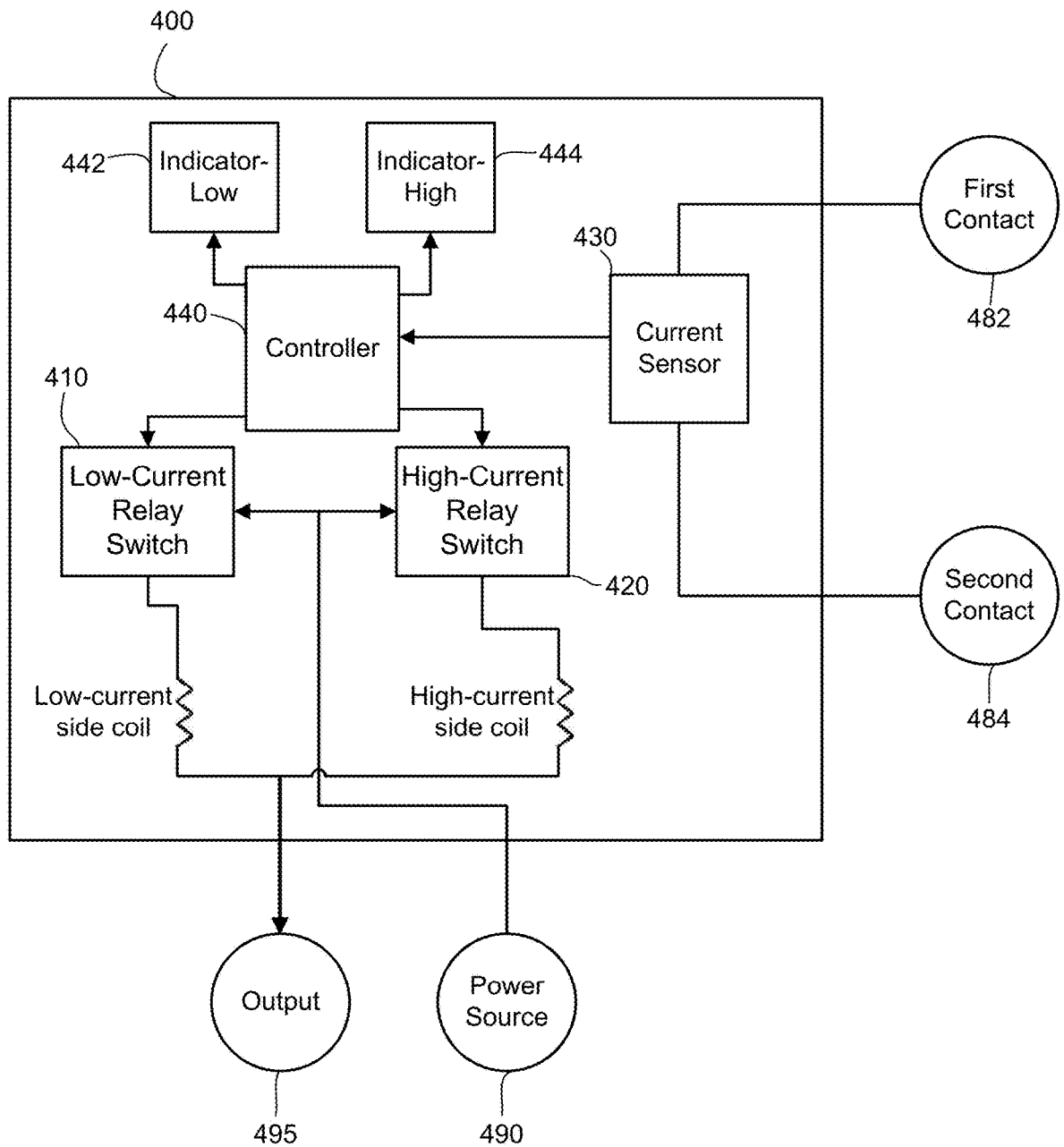
FIG. 4 is block diagram of a multi-relay according to an example embodiment.

FIG. 4 is a block diagram of a multi-relay according to another example embodiment. In some cases, the multi-relay 400 may implement the method 200 described with reference to FIG. 2, or perform the change of response described above with reference to FIG. 3.

Referring to FIG. 4, the multi-relay 400 includes a low-current relay switch 410, a high-current relay switch 420, a current sensor 430, a controller 440, and first and second indicators 442 and 444 (e.g.

The current sensor 430 detects current across a first input contact 482 (i.e., first contact 482) and a second input contact 484 (i.e., second contact 484). In some implementations, either the first contact 482 or the second contact 484 may be relatively positive. The current sensor 430 provides a signal to the controller 440 that indicates the value of the current.

The controller 440 controls the low-current relay switch 410 and/or the high-current relay switch 420 based on the value provided by the current sensor 430. The low-current relay switch 410 and the high-current relay switch 420 provide power from a power source 490 and to an output 495 based on signals from the controller 440. In some embodiments, the control may also control the first indicator 442 and/or the second indicator 444 to indicate which of the low-current relay switch 410 and/or the high-current relay switch 420 are activated.

As a non-limiting example, the controller may be a microcontroller, such as a peripheral interface controller (PIC) microcontroller. In some embodiments, the controller 440 may be implemented using circuitry as a hardware-only implementation. In some cases, the controller 440 may be incorporated within the current sensor 430.

In some embodiments, the low-current relay switch 410, the high-current relay switch 420, the current sensor 430, the power source 490, and the output 495 may be similar to the low-current relay switch 110, the high-current relay switch 120, the current sensor 130, the power source 190, and the output 195 described above with reference to FIG. 1. In addition, in some cases, the input 180 of FIG. 1 may be similar to the first contact 482 and the second contact 484.

Figure 5:
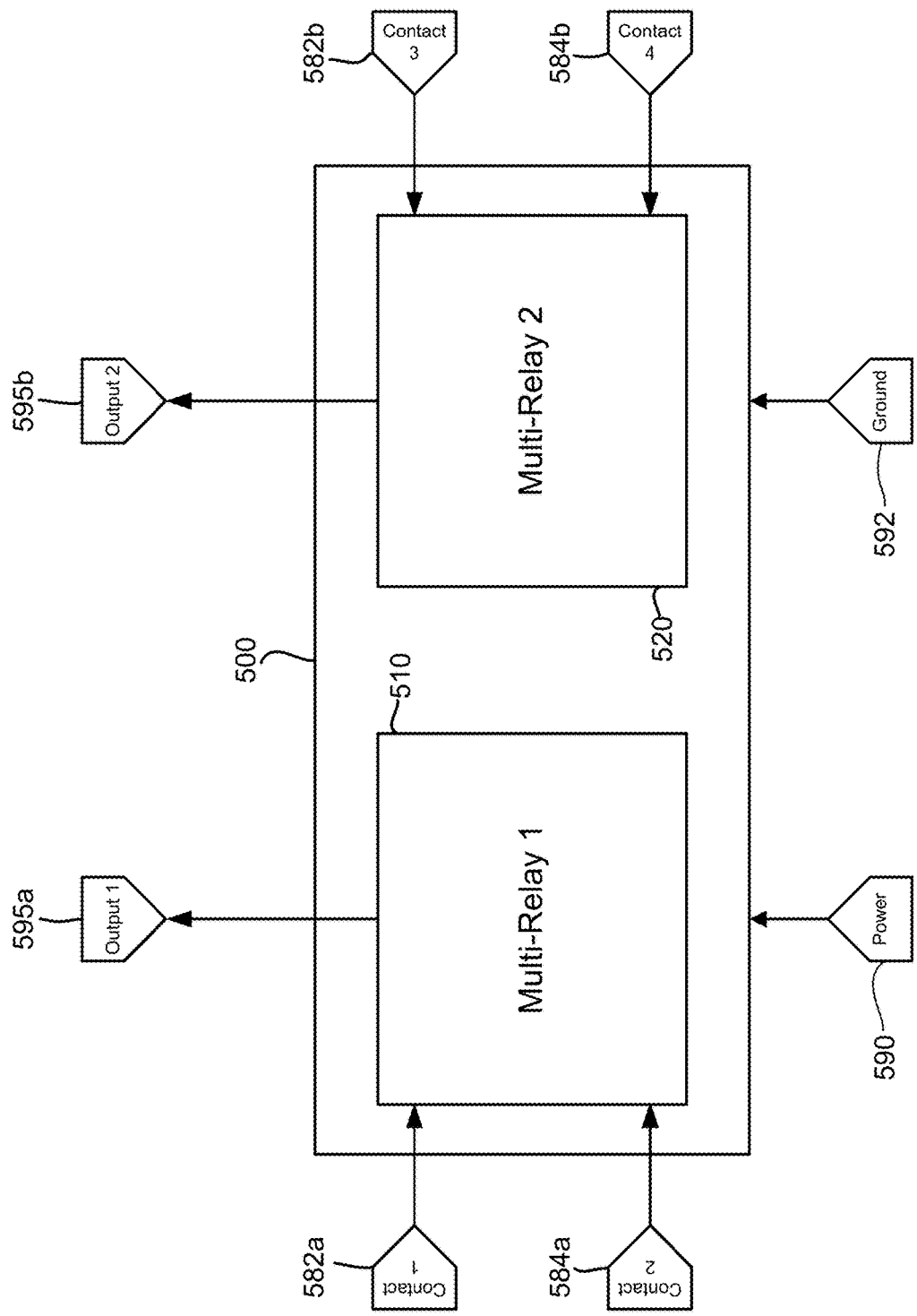
FIG. 5 is block diagram of a multi-access multi-relay according to an example embodiment.

FIG. 5 illustrates a multi-access multi-relay according to an example embodiment. Referring to FIG. 5, the multi-access multi-relay 500 includes a first multi-relay 510 and a second multi-relay 520. The first multi-relay 510 is connected to first and second contacts 582a and 584a. Based on an input from the first and second contacts 582a and 584a, the first multi-relay 510 outputs a current to a first output 595a. Similarly, the second multi-relay 520 is connected to third and fourth contacts 582b and 584b, and, based on an input from the third and fourth contacts 582b and 584b, outputs a current to a second output 595b. Power and ground may be supplied to the multi-access multi-relay 500 through a power contact 590 and a ground contact 592.

The first multi-relay 510 and the second multi-relay 520 may be implemented using respective low-current and high-current relays. As non-limiting examples, the first multi-relay 510 and the second multi-relay 520 may each be implemented as the multi-relay 100 or the multi-relay 400 discussed above with reference to FIGS. 1-4.

In some cases, the first and second contacts 582a and 584a may be reversible (i.e., either the first contact 582a or the second contact 584a may be the relatively high). Similarly, in some embodiments, the third and fourth contacts 582b and 584b may be reversible (i.e., either the third contact 582b or the fourth contact 584b may be the relatively high). In some embodiments, the power and ground contacts 590 and 592 may be reversible (i.e., either the power contact 590 or the ground contact 592 may be relatively high). Thus, in some cases, human error in the installation of the multi-access multi-relay 500 may be reduced.

Although the multi-access multi-relay 500 has been described with first through fourth contacts 582a, 584a, 582b, and 584b, this is merely an example. In some embodiments, the first and second contacts 582a and 584a may be used to control both the first multi-relay 510 and the second multi-relay 520. In addition, in some implementations, the multi-access multi-relay 500 may include three or more multi-relays, each with respective pairs of contacts.

The power 590 and the first output 595a may be similar to the power source 190, and the output 195 described above with reference to FIG. 1, or to the power source 490 and the output 495 as described above with reference to FIG. 4. The first contact 582a and the second contact 584a may be similar to the first contact 482 the second contact 484 as described above with reference to FIG. 4. Similarly, the third contact 582b and the fourth contact 584b may be similar to the first contact 482 the second contact 484 as described above with reference to FIG. 4.

In some cases, the input 180 of FIG. 1 may be similar to the first contact 582a and the second contact 584a or the third contact 582b and the fourth contact 584b of FIG. 5. In some embodiments, the multi-relay 100 and 400 may include a ground contact similar to ground contact 592 of FIG. 5.

In some cases, a multi-relay or a multi-access multi-relay according to one or more embodiments may be enclosed within a single body. In some cases, the body may be substantially water-proof or water-resistant and durable. The body may be made of, for example, molded plastic and rubber.

In some cases, a multi-relay or a multi-access multi-relay according to one or more embodiments may be incorporated within a larger device or circuit.

Figure 6:
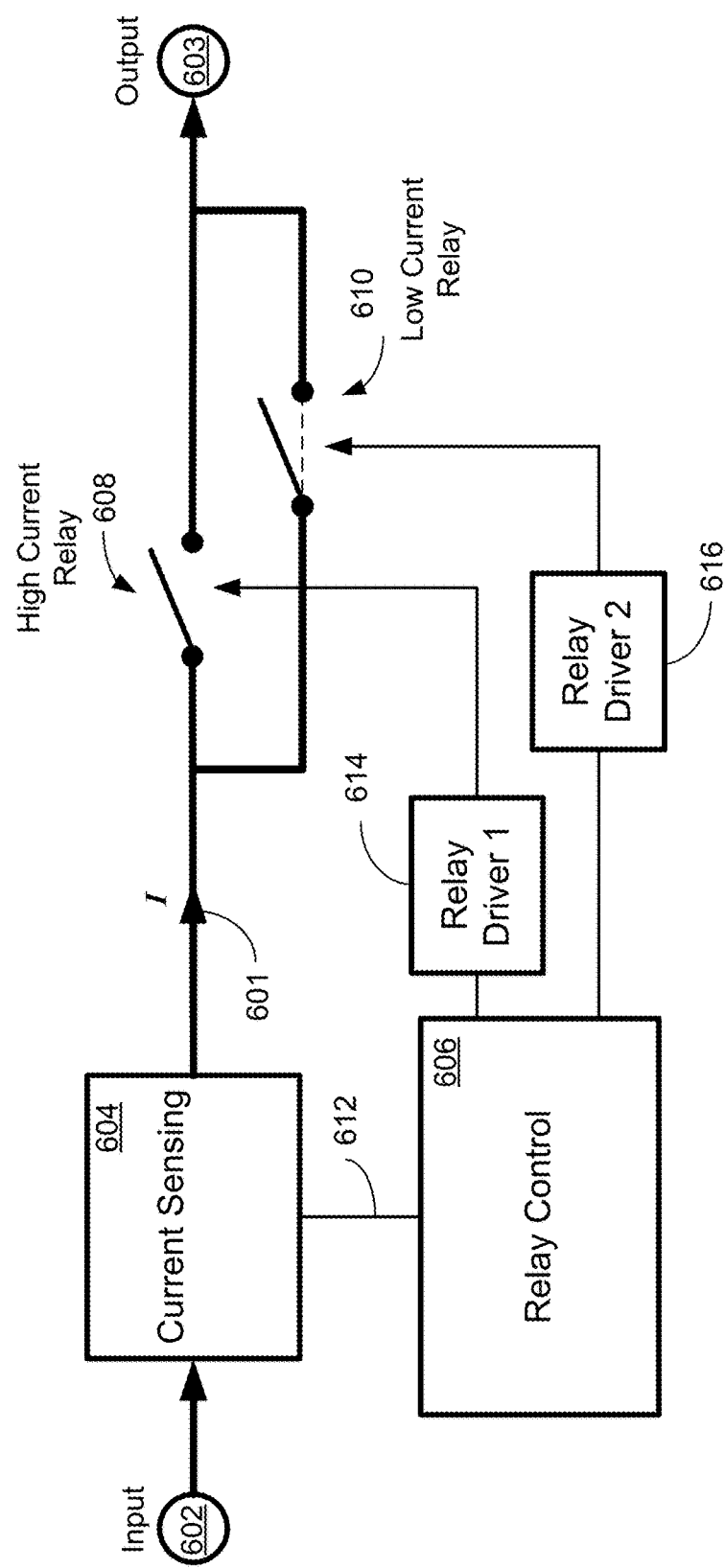
FIG. 6 is an example block diagram representation of a current sensing and relay control circuit according to certain example embodiments.

FIG. 6 is an example block diagram representation of a current sensing and relay control circuit, according to certain implementations of the disclosed technology. In an example implementation, the circuit 600 may be placed in series with an external circuit (not shown) to complete a current path between the input terminal 602 and the output terminal 603. A more detailed example of certain elements of FIG. 6 will be discussed below reference to FIG. 7 according to an example implementation.

Referring to FIG. 6, when one or more of the high current relay 608 and/or the low current relay 610 is in an ON-state (conducting), current I 601 will be allowed to flow from the input terminal 602 to the output terminal 603, through current sensing circuit 604 and (conducting) relay(s) 608 and 610.

In an example implementation, the current sensing circuit 604 may detect the current I 601 and generate a corresponding current level signal 612 (such as a voltage) for input to the relay control circuitry 606. In an example implementation, the relay control circuitry 606 may receive the current level signal 612, and depending on the current level signal 612, provide selective activation signals to the relay drivers 614 and 616. Relay drivers 614 and 616 may, in turn, control the relays 608 and 610.

In an example implementation, the circuit 600 may be configured, upon a power-on condition, to place one or more of the high current relay 608 and the low current relay 610 in the ON (or conducting) state by default (as indicated for example, by the dashed line in the low current relay 610) so that the initial current may flow through the circuit 600. Accordingly, the current sensing circuit 604 may sense the initial current flowing from the input terminal 602 to the output terminal 603. Responsive to the detected initial current, the relay control circuitry 606 and the relay driver circuitry 614 and 616 may switch the appropriate relays 614 and 616 in-or-out of circuit dependent upon the amount of current detected, and as selected by the design of the associated components (as will be discussed further below with reference to FIG. 7).

Figure 7:
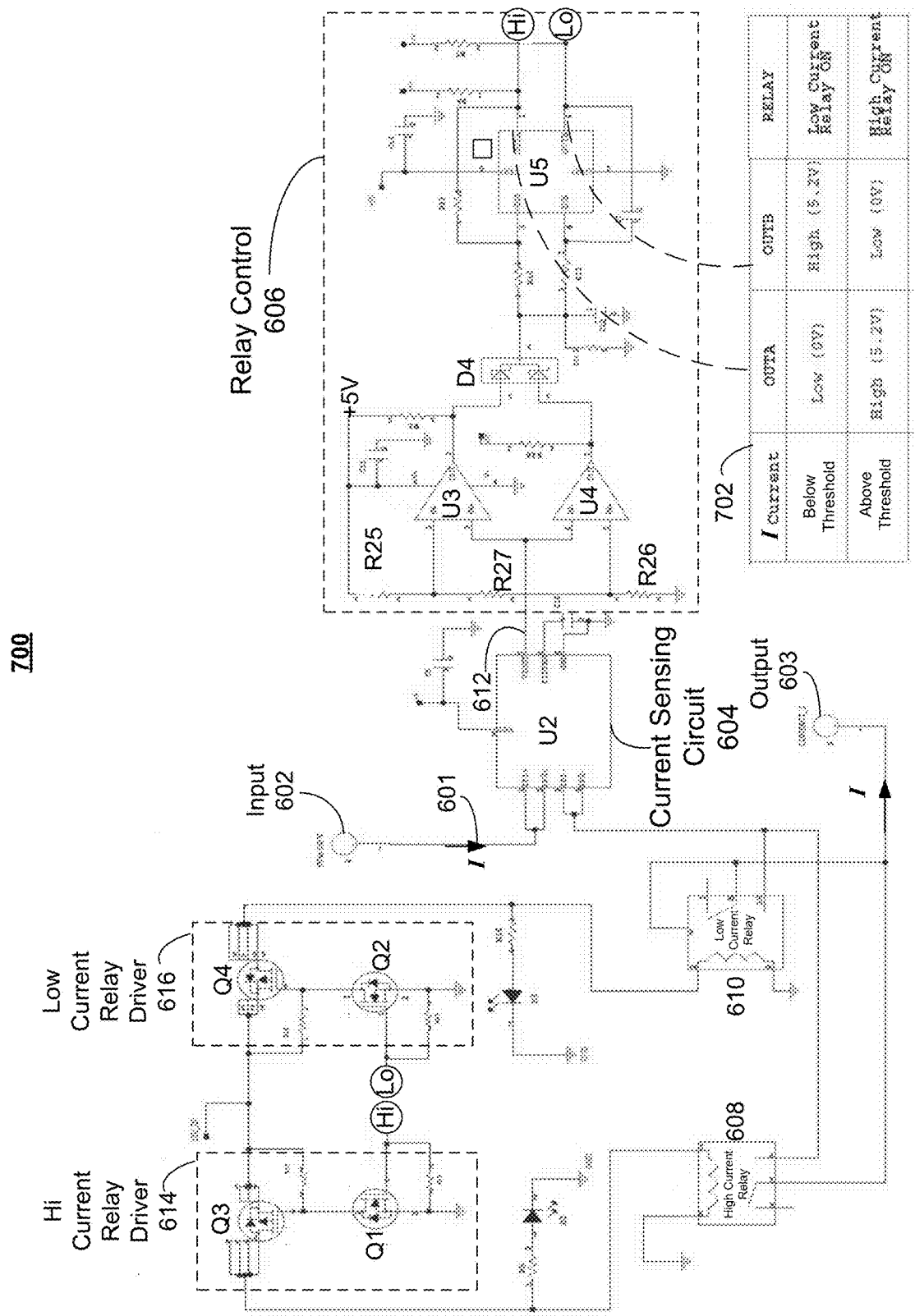
FIG. 7 is a detailed example schematic diagram of a current sensing and relay control circuit according to an example implementation.

FIG. 7 is a detailed example schematic diagram of a current sensing and relay control circuit according to an example implementation. Certain circuit elements and or groupings of circuit elements of FIG. 7 may correspond to certain like elements of the block diagram 600 of FIG. 6, according to an example implementation of the disclosed technology.

As discussed above with respect to FIG. 6, the circuit 700 may be placed in series with an external circuit (not shown) to complete a current path between the input terminal 602 and the output terminal 603. According to an example implementation of the disclosed technology, when one or more of the high current relay 608 and/or the low current relay 610 is in an ON-state (conducting), and when a potential is placed across the input terminal 602 and output terminal 603, current I 602 will be allowed to flow from the input terminal 602 to the output terminal 603, through the current sensing circuit (U2) 604 and the (conducting) relay (s) 608 and/or 610. One of ordinary skill will understand that the current sensing circuit (U2) 604 is merely an example implementation, and, in some implementations the current sensing circuit 604 may include a Hall-effect sensor.

In an example implementation, the relay control circuitry 606 may receive the current level signal 612, and depending on the signal 612, may provide selective activation signals to the relay drivers 614 and 616. The relay drivers 614 and 616 may be used to control the relays 608 and 610.

In an example implementation, the current sensing circuit 604 may detect the current I 601, and, in response, may output a corresponding current level signal 612 (such as a voltage) to the relay control circuitry 606. In an example implementation, the relay control circuitry 606 may be configured with a voltage divider network (such as R25-R27) in communication with one or more comparators (such as U3 and U4). In accordance with an example implementation, resistance values may be selected for R25, R26, and R27 in the voltage divider network (within the relay control circuitry 606) to allow the appropriate reference voltage values to be input to the terminals of the comparators U3 and U4 for the desired activation of the relays 608 and 610. In other words, the conduction state of the relays 608 and 610 may be controlled based on a comparison of the current level signal 612 with the reference voltages that are set by the resistance values selected for R25, R26, and R27, where the current level signal 612 corresponds to the amount of current I 601 detected by the current sensing circuit 604.

The high current relay driver 614 and low current relay driver 616 receive current level signals from the relay control circuitry 606 via the indicated Hi and Lo paths. Transistors Q1 and Q3 of the high current relay driver 614 receive the current level signal from the relay control circuit 606 via the high path to produce a signal to control the high current relay 608. Transistors Q2 and Q4 of the low current relay driver 616 receive the current level signal from the relay control circuit 606 via the low path to produce a signal to control the low current relay 610.

FIG. 7 includes an inset truth table 702 summarizing an example overall behavior of the circuit 700 for measured current I 601 below 1 ampere, and above 1 ampere. For example, when the current I 601 is less than 1 ampere, the outputs of comparators U3 and U4 are supplied to isolator D4. Isolator D4 combines the inputs of U3 and U4 and provides and output to be interpreted by the buffer driver circuitry U5 to provide a logic high signal to the low current relay driver 616 (via Lo path indicated) and a low logic signal to the high current relay driver 614 (via Hi path indicated) resulting in the low current relay 610 being driven in the conducting state, while the high current relay 608 is non-conducting. In this sense, only the low current relay 610 needs to be on since the measured current I 601 is below 1 ampere, and the low current relay 610 may be selected or designed to handle such current without overloading, heating, arcing, etc.

In the example situation where the current I 601 is above 1 ampere, and as illustrated by the inset truth table 702, the output of comparator U3 may be in a high state and the output of comparator U4 may be in a low state, which may in turn be interpreted by the buffer driver circuitry U5 to provide a logic high signal to the high current relay driver 614 (via Hi path indicated) and a low logic signal to the low current relay driver 616 (via Lo path indicated) resulting in the high current relay 608 being driven in the conducting state, while the low current relay 610 is non-conducting. In this sense, only the high current relay 608 needs to be on since the measured current I 601 is greater than 1 ampere. The high current relay 608 may be selected or designed to handle such current without overloading, heating, arcing, etc.

According to an example implementation, the components included with the relay control circuit 606 may be selected to provide a switching point or range based on other values of measured current I 601 besides 1 ampere. In certain example implementations, the components included with the relay control circuit 606 may be selected so that only the low current relay 610 is engaged below a certain predetermined lower threshold current, only the high current relay 608 is engaged for currents above a certain predetermined upper threshold current, and both the low current relay 610 and the high current relay 608 are engaged within a certain predetermined range between the lower threshold current and the upper threshold current.

In some embodiments, the multi-relay may include two contacts for receiving power (e.g., power and ground contacts 590 and 592 of FIG. 5). In some implementations, the multi-relay may include circuitry to accept power of reversible polarity supplied to the two contacts (i.e., either contact may be connected to a relatively high power supply). In some implementations, the multi-relay may include circuitry configured to adjust the input power to at least one supply power for various components of the multi-relay.

The present disclosure can be understood more readily by reference to the above detailed description and figures of one or more example embodiments and the examples included herein. It is to be understood that embodiments are not limited to the example embodiments described within this disclosure. Numerous modifications and variations therein will be apparent to those skilled in the art and remain within the scope of the disclosure. It is also to be understood that the terminology used herein is for describing specific example embodiments only and is not intended to be limiting. It is intended that each term contemplates its broadest meaning as understood by those skilled in the art and includes all technical equivalents that operate in a similar manner to accomplish a similar purpose. Some example embodiments of the disclosed technology were described more fully with reference to the accompanying drawings. The disclosed technology might, however, be embodied in many different forms and should not be construed as limited to the example embodiments set forth herein.

In the above description, numerous specific details are set forth. However, it is to be understood that embodiments of the disclosed technology may be practiced without these specific details. In other instances, well-known methods, structures, and techniques have not been shown in detail in order to avoid obscuring an understanding of this description. References to "one embodiment," "an embodiment," "example embodiment," "some embodiments," "certain embodiments," "various embodiments," etc., indicate that the example embodiment(s) of the disclosed technology so described may include a particular feature, structure, or characteristic, but not that every embodiment necessarily includes the particular feature, structure, or characteristic. Further, repeated use of the phrase "in one embodiment" does not necessarily refer to the same embodiment, although it may.

Unless otherwise noted, the terms used herein are to be understood according to conventional usage by those of ordinary skill in the relevant art. In addition to any definitions of terms provided below, it is to be understood throughout the specification and the claims, the following terms take at least the meanings explicitly associated herein, unless the context clearly dictates otherwise. The term "or" is intended to mean an inclusive "or." Further, the terms "a," "an," and "the" are intended to mean one or more unless specified otherwise or clear from the context to be directed to a singular form.

Unless otherwise specified, the use of the ordinal adjectives "first," "second," "third," etc., to describe a common object, merely indicates that different instances of like objects are being referred to, and are not intended to imply that the objects so described must be in a given sequence, either temporally, spatially, in ranking, or in any other manner.

The materials described herein as making up the various elements of the example embodiments of the present disclosure are intended to be illustrative only and not restrictive. Many suitable materials that would perform a same or a similar function as the materials described herein are intended to be embraced within the scope of the example embodiments. Such other materials not described herein can include, but are not limited to, materials that are developed after the time of the development of the invention.

While certain embodiments of the disclosed technology have been described in connection with what is presently considered to be the most practical embodiments, it is to be understood that the disclosed technology is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the disclosed technology, including the best mode, and also to enable any person skilled in the art to practice certain embodiments of the disclosed technology, including making and using any devices or systems and performing any incorporated methods. The patentable scope of certain embodiments of the disclosed technology is defined in the claims and their equivalents, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A multi-access relay comprising:
   a first multi-relay;
   a second multi-relay;
   first and second contacts for receiving a control current of the first multi-relay; and
   third and fourth contacts for receiving a control current of the second multi-relay,
   wherein each of the first multi-relay and the second multi-relay comprise:
      a respective first relay switch operable over a first current range;
      a respective second relay switch operable over a second current range; and
      a respective current sensor configured to:
         detect the respective control current;
         in response to detecting the respective control current being within the first current range, activate the respective first relay switch; and
         in response to detecting the respective control current being within the second current range, activate the respective second relay switch.

2. The multi-access relay of claim 1, wherein, for at least one of the first multi-relay and the second multi-relay, a portion of the first current range overlaps a portion of the second current range.

3. The multi-access relay of claim 1, wherein, for at least one of the first multi-relay and the second multi-relay, the respective first relay switch and the respective second relay switch are connected in parallel.

4. The multi-access relay of claim 1, wherein, for at least one of the first multi-relay and the second multi-relay, the respective current sensor is further configured to:
   repeatedly monitor the respective control current;

activate the respective first relay switch while the respective control current in response to detecting the respective control current being within the first current range; and activate the respective second relay switch while the respective control current in response to detecting the respective control current being within the second current range.

5. The multi-access relay of claim 4, wherein, for at least one of the first multi-relay and the second multi-relay, the respective current sensor is further configured to:

deactivate the respective first relay switch in response to detecting the respective control current being greater than the first current range; and deactivate the respective second relay switch in response to detecting the respective control current being lesser than the second current range.

6. The multi-access relay of claim 1, wherein, for at least one of the first multi-relay and the second multi-relay, a lower threshold of the first current range of the respective first relay switch is at least five orders of magnitude less than an upper threshold of the second current range of the respective second relay switch using an Ampere unit of measurement.

7. The multi-access relay of claim 1, wherein, for at least one of the first multi-relay and the second multi-relay, the respective current sensor is configured to detect the respective control current, activate the respective first relay switch, and activate the respective second relay switch without the use of software components.

8. The multi-access relay of claim 1, wherein at least one of the first multi-relay and the second multi-relay is configured to be installed on either side of load relative to a power source.

9. The multi-access relay of claim 1, wherein, for at least one of the first multi-relay and the second multi-relay, the current sensor is configured to detect the input current of multiple polarities.

10. A method performed by a multi-access relay including a first multi-relay and a second multi-relay, each of first multi-relay and the second multi-relay comprising a respective first relay switch operable over a first current range, a respective second relay switch operable over a second current range; and a respective current sensor, the method comprising:

activating the first relay switch of the first multi-relay;

detecting, by the current sensor of the first multi-relay, an input current of the first multi-relay; and in response to detecting that the input current is within the second current range of the first multi-relay, activating the second relay switch of the first multi-relay.

11. The method of claim 10, wherein the detecting comprises detecting, by the current sensor of the first multi-relay, the input current over time, the activating the first relay switch of the first multi-relay comprises activating the first relay switch of the first multi-relay while the input current is within the first current range, and the activating the second relay switch of the first multi-relay comprises activating the second relay switch while the input current is within the second current range.

12. The method of claim 10 further comprising:

deactivating the first relay switch of the first multi-relay in response to detecting that the input current is outside of the first current range; and deactivating the second relay switch of the first multi-relay in response to detecting that the input current is outside of the second current range.

13. The method of claim 10, wherein the activating the second relay switch of the first multi-relay is performed while the first relay switch of the first multi-relay is activated.

14. The method of claim 10 further comprising:

activating the first relay switch of the second multi-relay;

detecting, by the current sensor of the second multi-relay, an input current of the second multi-relay; and in response to detecting that the input current of the second multi-relay is within the second current range of the second multi-relay, activating the second relay switch of the second multi-relay.

15. The method of claim 14, wherein the detecting the input current of the second multi-relay comprises detecting, by the current sensor of the second multi-relay, the input current over time, the activating the first relay switch of the second multi-relay comprises activating the first relay switch of the second multi-relay while the input current of the second multi-relay is within the first current range, and the activating the second relay switch of the second multi-relay comprises activating the second relay switch of the second multi-relay while the input current of the second multi-relay is within the second current range.

16. The method of claim 14 further comprising:

deactivating the first relay switch of the second multi-relay in response to detecting that the input current of the second multi-relay is outside of the first current range; and deactivating the second relay switch of the second multi-relay in response to detecting that the input current of the second multi-relay is outside of the second current range.

17. The method of claim 14, wherein the activating the second relay switch of the second multi-relay is performed while the first relay switch of the second multi-relay is activated.

18. A multi-access relay comprising:

a first multi-relay;

a second multi-relay;

first and second contacts for receiving a control current of the first multi-relay; and third and fourth contacts for receiving a control current of the second multi-relay, wherein each of the first multi-relay and the second multi-relay comprise:

a respective low-current relay operable over a first current range;

a respective high-current relay operable over a second current range, an upper threshold of the second current range being greater than an upper threshold of the first current range; and a respective current sensing circuit configured to:

detect the respective control current;

in response to detecting the respective control current being within the first current range, activate the respective low-current relay; and in response to detecting the respective control current being within the second current range, activate the respective high-current relay.

19. The multi-access relay of claim 18, wherein each of the first multi-relay and the second multi-relay further comprise:

a low-current relay driver configured to receive a current level signal from the current sensing circuit and control activation of the low-current relay; and a high-current relay driver configured to receive a current level signal from the current sensing circuit and control activation of the high-current relay.

20. The multi-access relay of claim 18, wherein, for at least one of the first multi-relay and the second multi-relay, a portion of the first current range overlaps a portion of the second current range.

* * * * *